(12) United States Patent
Heck et al.

(10) Patent No.: US 8,084,282 B2
(45) Date of Patent: Dec. 27, 2011

(54) WAFER-LEVEL IN-P SI BONDING FOR SILICON PHOTONIC APPARATUS

(75) Inventors: John Heck, Berkeley, CA (US);
Richard Jones, San Mateo, CA (US);
Matthew N. Sysak, Santa Barbara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/753,654

(22) Filed: Apr. 2, 2010

(65) Prior Publication Data

US 2011/0244613 A1    Oct. 6, 2011

(51) Int. Cl.
*H01L 21/00* (2006.01)
*H01L 21/30* (2006.01)
*H01L 21/265* (2006.01)

(52) U.S. Cl. ............. 438/23; 438/45; 438/46; 438/458; 438/518

(58) Field of Classification Search .................. None
See application file for complete search history.

(56) References Cited

U.S. PATENT DOCUMENTS 6,562,127 B1 * 5/2003 Kud et al. .................. 117/94

\* cited by examiner

*Primary Examiner* — Scott B Geyer
(74) *Attorney, Agent, or Firm* — John N. Greaves (57) ABSTRACT

Wafer-level bonding of the hybrid laser portion of a silicon photonics platform is done by forming a weakened level in a semiconductive pillar that supports laser-active layers by ion implantation into the semiconductive pillar without penetrating the laser-active layers, and by separating the laser-active layers from the semiconductive pillar by cracking the weakened level by an epitaxial lift-off processes.

12 Claims, 6 Drawing Sheets

WAFER-LEVEL IN-P SI BONDING FOR SILICON PHOTONIC APPARATUS

Disclosed embodiments relate to hybrid laser semiconductor microelectronic devices and processes of making them.

BRIEF DESCRIPTION OF THE DRAWINGS

In order to understand the manner in which embodiments are obtained, a more particular description of various embodiments briefly described above will be rendered by reference to the appended drawings. These drawings depict embodiments that are not necessarily drawn to scale and are not to be considered to be limiting in scope. Some embodiments will be described and explained with additional specificity and detail through the use of the accompanying drawings in which.

DETAILED DESCRIPTION

Processes are disclosed where hybrid laser embodiments are formed by integrating an InP die onto a silicon wafer that may contain a waveguide, a modulator, or other laser-use devices. The processes are described with wafer-level processing embodiments, but the processes may also be applied to die-level processing.

Reference will now be made to the drawings wherein like structures may be provided with like suffix reference designations. In order to show the structures of various embodiments more clearly, the drawings included herein are diagrammatic representations of integrated circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings.

Figure 1A:
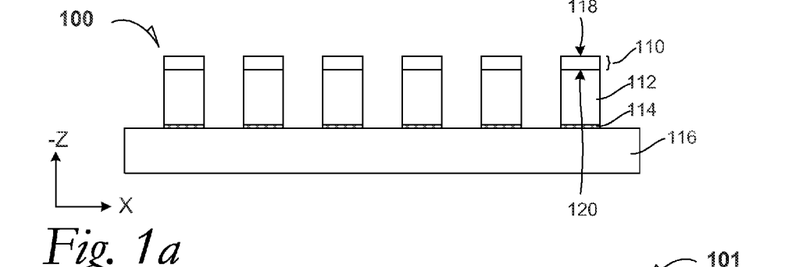
FIG. 1a is a cross-section elevation of a hybrid laser apparatus during processing according to an example embodiment.

FIG. 1a is a cross-section elevation of a hybrid laser apparatus 100 during processing according to an example embodiment. A structure of laser-active layers 110 is disposed upon a semiconductive pillar 112 as epitaxial layers 110. The laser-active layers 110 may also be referred to as a laser stack 110 or merely a stack 110. The semiconductive pillar 112 is in contact with an adhesive 114, which in turn may be adhered to a handle wafer 116. The handle wafer 116 is used to support the semiconductive pillar 112. Processing is also done at the die level for single structures of laser-active layers according to an embodiment.

In an embodiment, the active layers 110 include multiple layers that are precursors for the formation of a multi-layered III-V wafer that is used for a hybrid laser apparatus. As depicted, the laser-active layers 110 include an adhesion surface 118 and a stack top 120.

Figure 1B:
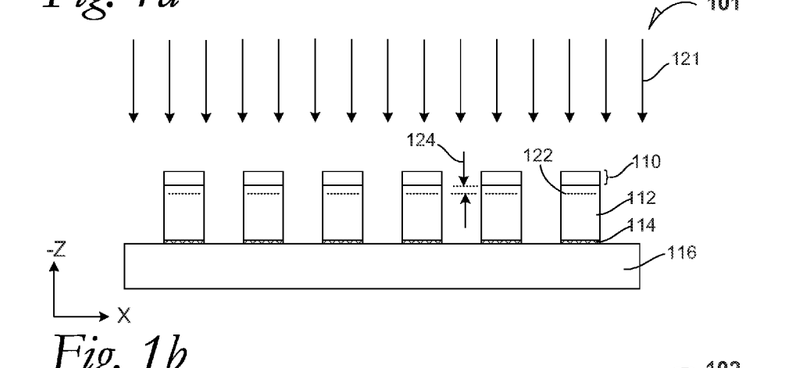
FIG. 1b is a cross-section elevation of the hybrid laser apparatus depicted in FIG. 1a after further processing according to an embodiment.

FIG. 1b is a cross-section elevation of the hybrid laser apparatus depicted in FIG. 1a after further processing according to an embodiment. The hybrid laser apparatus 101 is being processed to form a weakened level 122 in the semiconductive pillar 112. In an embodiment, the semiconductive pillar 112 is an indium phosphide (InP) semiconductor that may be doped with other materials such as Group II, IV, and VI dopants.

A process embodiment of forming the weakened level 122 includes hydrogen-ion ($H^+$) implanting at an energy amount that achieves a weakened-level depth 124 below the stack top 120. Downward directional arrows 121 indicate a directional $H^+$ implanting process. Other ions may be used in addition to or in place of the $H^+$ ions. In an embodiment, the weakened-level depth 124 is in a range from 0.01 micrometer ($\mu m$) to 2 $\mu m$ below the stack top 120. In an embodiment, the weakened-level depth 124 coincides with the stack top 120 as set forth herein below.

Figure 1C:
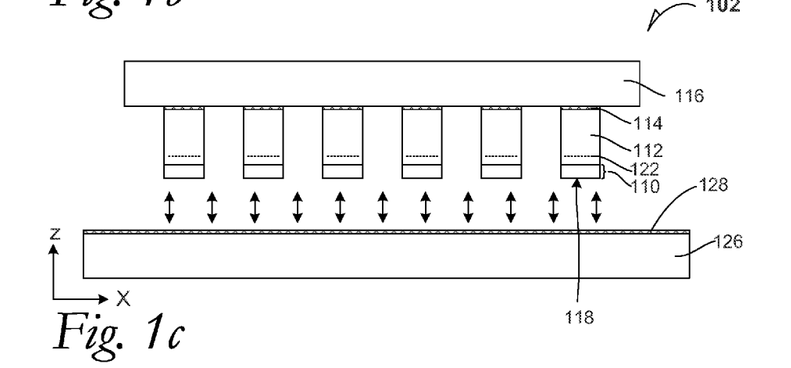
FIG. 1c is a cross-section elevation of the hybrid laser apparatus depicted in FIG. 1b after further processing according to an embodiment.

FIG. 1c is a cross-section elevation of the hybrid laser apparatus depicted in FIG. 1b after further processing according to an embodiment. The apparatus 102 shows that the handle wafer 116 and the structures it supports have been inverted with respect to the Z-direction. The adhesion surface 118 is depicted as being brought into proximity to a target wafer 126 as indicated by the bi-directional arrows. The transfer wafer 126 is a silicon photonic device with waveguides according to an embodiment. The transfer wafer 126 may also be referred to as a target wafer 126.

The target wafer 126 has a dielectric material 128 that will contact the adhesion surface 118 of the laser-active layers 110. In an embodiment, the dielectric material 128 is a native oxide layer that has formed on the surface of the target wafer 126, which may be a silicon-based semiconductive material. In an embodiment, the dielectric material 128 is a thermal oxide layer that has formed on the surface of the target wafer 126. In an embodiment, the dielectric material 128 is a dielectric nitride material such as an oxynitride layer that has formed on the surface of the target wafer 126.

Figure 1D:
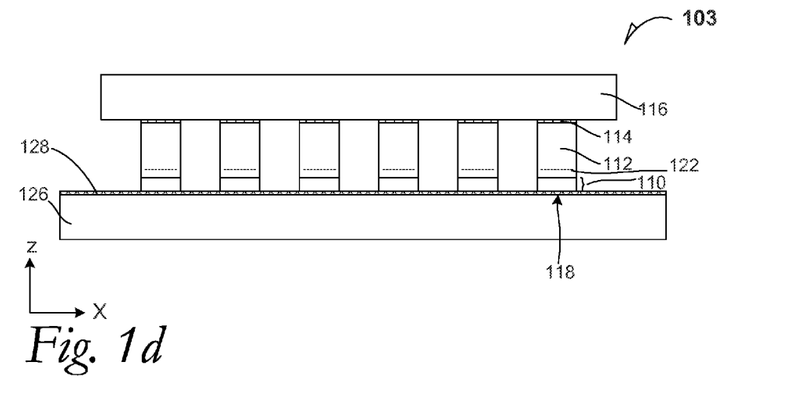
FIG. 1d is a cross-section elevation of the hybrid laser apparatus depicted in FIG. 1c after further processing according to an embodiment.

FIG. 1d is a cross-section elevation of the hybrid laser apparatus depicted in FIG. 1c after further processing according to an embodiment. The apparatus 103 is shown to have contact made between the adhesion surface 118 of the laser-active layers 110 and the target wafer 126 at the dielectric material 128.

In a process embodiment, the mated target wafer 126 and the laser-active layers 110 are treated under enhanced heating conditions to effect cracking of the semiconductive pillar 112 at the weakened level 122. In an embodiment, processing is carried out in a temperature range from 250° C. to 350° C. and a processing time from 0.5 hour (hr) to 1.5 hr. In an embodiment, processing of an InP semiconductive pillar 112 is carried out at a temperature of about 300° C. and a processing time of about 1 hr and H$^+$ implantation at the weakened level 122 results in cracking of the semiconductive pillar 112.

Figure 1E:
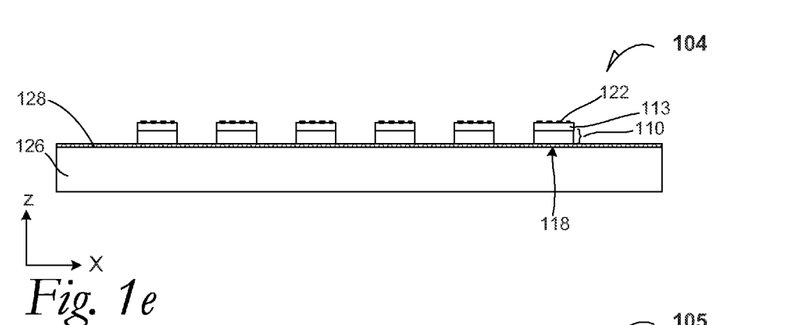
FIG. 1e is a cross-section elevation of the hybrid laser apparatus depicted in FIG. 1d after further processing according to an embodiment.

FIG. 1e is a cross-section elevation of the hybrid laser apparatus depicted in FIG. 1d after further processing according to an embodiment. The apparatus 104 is shown with a cracking effect at the weakened level 122 and with a residual semiconductive pillar 113 that is derived from the semiconductive pillar 112 (FIGS. 1a-1d). The cracking at the weakened level 122 may be referred to as a laser-active layer epitaxial lift-off (ELO) process. The laser-active layer ELO process allows for integrating a laser-active apparatus to a semiconductive substrate without the need for wafer debonding processing tools. Consequently, the hybrid laser is accomplished by coupling light from the III-V material of the laser-active layers 110 with the transfer wafer 126.

In an embodiment, implanting to form the weakened level 122 is controlled to reduce the weakened-level depth 124 to essentially zero. Consequently, implanting stops essentially at the stack top 120. In an embodiment, the top layer that is or will become the stack top 120 is prepared to be thicker than the intended final thickness such that the laser-active layer ELO processing leaves sufficient material to achieve the intended result of a hybrid laser apparatus. As a consequence of making the weakened-level depth 124 essentially zero, the process of separating the active layers 110 from the semiconductive pillar 112 (FIGS. 1a-1d) simultaneously exposes the laser-active layers 110.

In an embodiment, implanting to reduce the weakened-level depth 124 to essentially zero, followed by laser-active layer ELO processing is done such that the laser-active layers 110 are simultaneously exposed at the stack top 120 upon cracking. In an embodiment, implanting to reduce the weakened-level depth 124 to essentially zero, followed by laser-active layer ELO processing is done such that the laser-active layers 110 are simultaneously exposed at the stack top 120, but some grinding or lapping is done to clean the laser-active layers 110. This process of cleaning achieves a useful degree of planarity at the stack top 120.

Figure 1F:
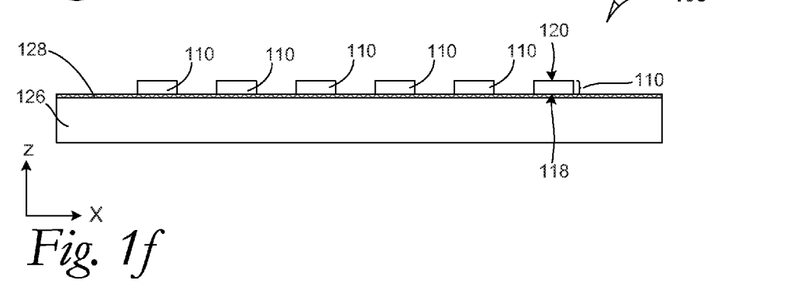
FIG. 1f is a cross-section elevation of the hybrid laser apparatus depicted in FIG. 1f after further processing according to an embodiment.

FIG. 1f is a cross-section elevation of the hybrid laser apparatus depicted in FIG. 1f after further processing according to an embodiment. The apparatus 105 has been processed to remove the residual semiconductive pillar 113 to expose the semiconductive active layers 110 at the stack top 120. In an embodiment, the residual semiconductive pillar 113 is removed by a wet etch that is selective to leaving the semiconductive active layers 110. In an embodiment, the residual semiconductive pillar 113 is removed by a planarizing process that is selective to leaving the semiconductive active layers 110. In an embodiment, the residual semiconductive pillar 113 is removed by a grinding or lapping process that is selective to leaving the semiconductive active layers 110.

In an embodiment, further processing is carried out such as patterning and metalizing the semiconductive active layers. After further processing of patterning and metalizing, the target wafer 126 that holds the semiconductive active layers 110 is singulated into hybrid laser emitter dice 110. These apparatus may be referred to as silicon photonics platforms.

Figure 2:
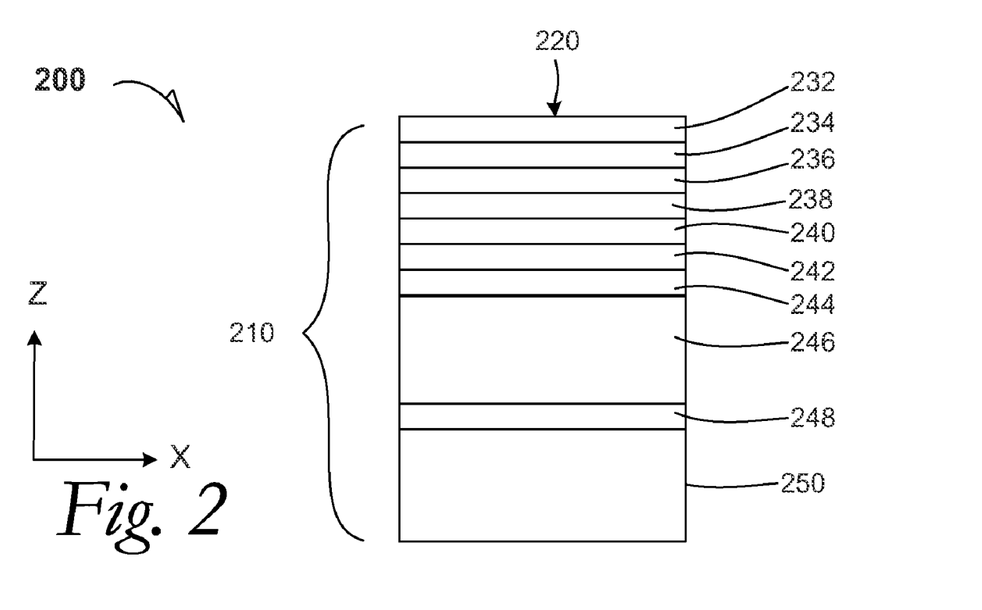
FIG. 2 is a cross-section elevation of a hybrid laser apparatus that includes a semiconductive active layer that has been subjected to a laser-active layer epitaxial liftoff process according to an example embodiment.

FIG. 2 is a cross-section elevation of a hybrid laser apparatus 200 that includes semiconductive active layers 210 that have been subjected to a laser-active layer epitaxial liftoff process according to an example embodiment. After the laser-active layer ELO process is completed, further processing may be done to connect electrodes to the laser-active layer as well as patterning and doping within the laser-active layer 210 to achieve a useful hybrid laser embodiment.

In an embodiment, the laser-active layers 210 include layers such as an initial base structure of a multi-layered III-V wafer that can be processed. The illustrated, non-limiting embodiment includes 10 layers. A first layer 232 includes 500 nm sacrificial InP and is or may become a stack top 220. Next, a layer 234 includes 20 nm InGaAsP as an etch-stop layer with a photoluminescence (PL) of 1.03 µm. Next, a layer 236 includes 100 nm of n-InP that is doped with $10^{18}$ cm$^{-3}$ of n-type dopant. Next, layer 238 includes 7.5/7.5 nm (2×) of InGaAsP/InP superlattice (SL) that is doped with $10^{18}$ cm$^{-3}$ n-type dopant with a PL of 1.03 µm. Next, a layer 240 includes 110 nm of n-InP that is doped with $10^{18}$ cm$^{-3}$ n-type dopant. Next, a layer 242 includes 100 nm of InGaAsP (Well/Bar) with a PL of 1.03 µm. Next, a layer 244 includes 250 nm of InGaAsP as a p-separate confined heterostructure that is doped with $10^{17}$ cm$^{-3}$ p-type dopant and a PL of 1.3 µm. Next, a layer 246 includes 1.5 µm of p-InP that is doped with $10^{18}$ cm$^{-3}$ of p-type dopant. Next, a layer 248 includes 100 nm of p-InGaAs that is doped with $10^{19}$ cm$^{-3}$ p-type dopant. And finally, a 300 µm thick substrate 250 is provided.

Processing of such a structure may include fabricating a multi-wavelength array of hybrid silicon lasers by patterning optical waveguides and applying a quantum well intermixing process to the III-V the laser-active layers 210. Thereafter, fabricating III-V mesa structures and applying metal for p-type and n-type contacts may be included. Optical frequency selective gratings can also be added to the process. Further processing may be done to achieve a useful hybrid laser emitter.

In an embodiment, the laser-active layers 210 may be fabricated as an AlGaInAs/InP wafer.

Figure 3A:
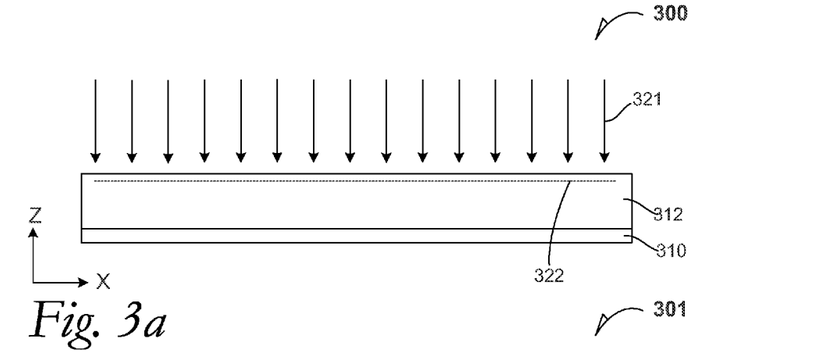
FIG. 3a is a cross-section elevation of a hybrid laser apparatus during processing according to an example embodiment.

FIG. 3a is a cross-section elevation of a hybrid laser apparatus 300 during processing according to an example embodiment. A structure of laser-active layers 310 is disposed upon a semiconductor wafer 312, such as InP.

A process embodiment of forming the weakened level 322 includes H$^+$ implanting at an energy amount that achieves a weakened-level depth 324 below the stack top 320. Downward directional arrows 321 indicate a directional H$^+$ implanting process. Consequently, implanting to form the weakened level is done by ion implanting into the InP structure of the semiconductive pillar 316 without penetrating the laser-active layers 310. By not traversing the laser-active layers 310 with, e.g. H$^+$ ions, incidental rearrangement of the crystal lattices and structures is confined to the semiconductive pillar 316 and further transformation is avoided or minimized in the laser-active layers 310. After implantation, the semiconductive pillars are diced and assembled to a handle wafer.

Figure 3B:
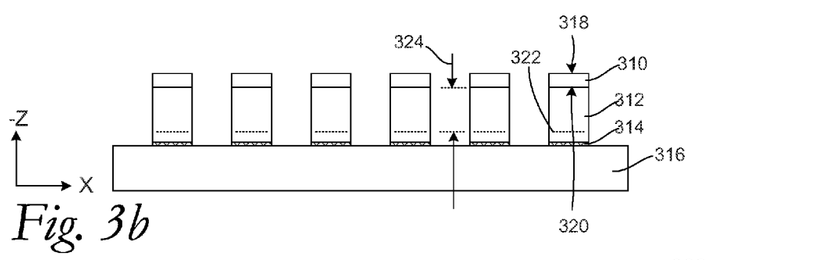
FIG. 3b is a cross-section elevation the hybrid laser apparatus depicted in FIG. 3a after further processing according to an embodiment.

FIG. 3b is a cross-section elevation the hybrid laser apparatus depicted in FIG. 3a after further processing according to an embodiment. The hybrid laser apparatus 301 has been diced and mounted onto a handle wafer 316. The semiconductive pillar 312 is in contact with an adhesive 314, which in turn is adhered to the handle wafer 316. In an embodiment, singulated laser-active layer structures are processed at the die level such that no handle wafer is present.

In an embodiment, the laser-active layers 310 include multiple layers that are precursors for the formation of a multi-layered III-V wafer that is used for a hybrid laser apparatus. As depicted the, laser-active layers 310 include an adhesion surface 318 and a stack top 320. The hybrid laser apparatus 300 is being processed to form a weakened level 322 in the semiconductive pillar 312. In an embodiment, the semiconductive pillar 312 is an indium phosphide (InP) semiconductor that may be doped with other materials such as Group II, IV, and VI dopants.

Figure 3C:
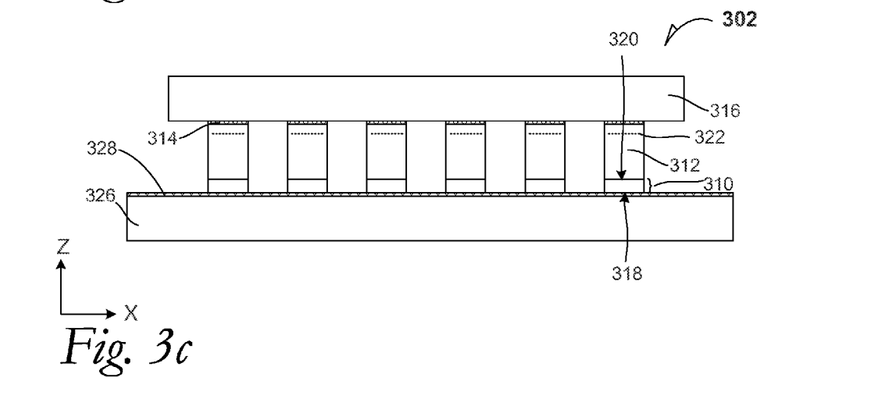
FIG. 3c is a cross-section elevation the hybrid laser apparatus depicted in FIG. 3a after further processing according to an embodiment.

FIG. 3c is a cross-section elevation the hybrid laser apparatus depicted in FIG. 3b after further processing according to an embodiment. The hybrid laser apparatus 302 has been processed starting with inverting. In an embodiment, the weakened-level depth 324 is in a range from 0.1 to 5 microns above the adhesive 314. The handle wafer 316 is brought into contact with a target wafer 326 which is analogous to the handle wafer 126 depicted in FIG. 1d, and the InP pillars are bonded to the handle wafer 326 using a plasma-activation process using a dielectric film 328. Upon annealing at high temperature, the InP pillars split at the weakened level 322, resulting in separation of the handle wafer 316 and target wafer 326. The non-active portion of the pillars 312 may then be removed by chemical etching or plasma etching, such that only the active layers 310 remain on the target wafer 326. Further processing may be done according to the several embodiments set forth in this disclosure.

Figure 4:
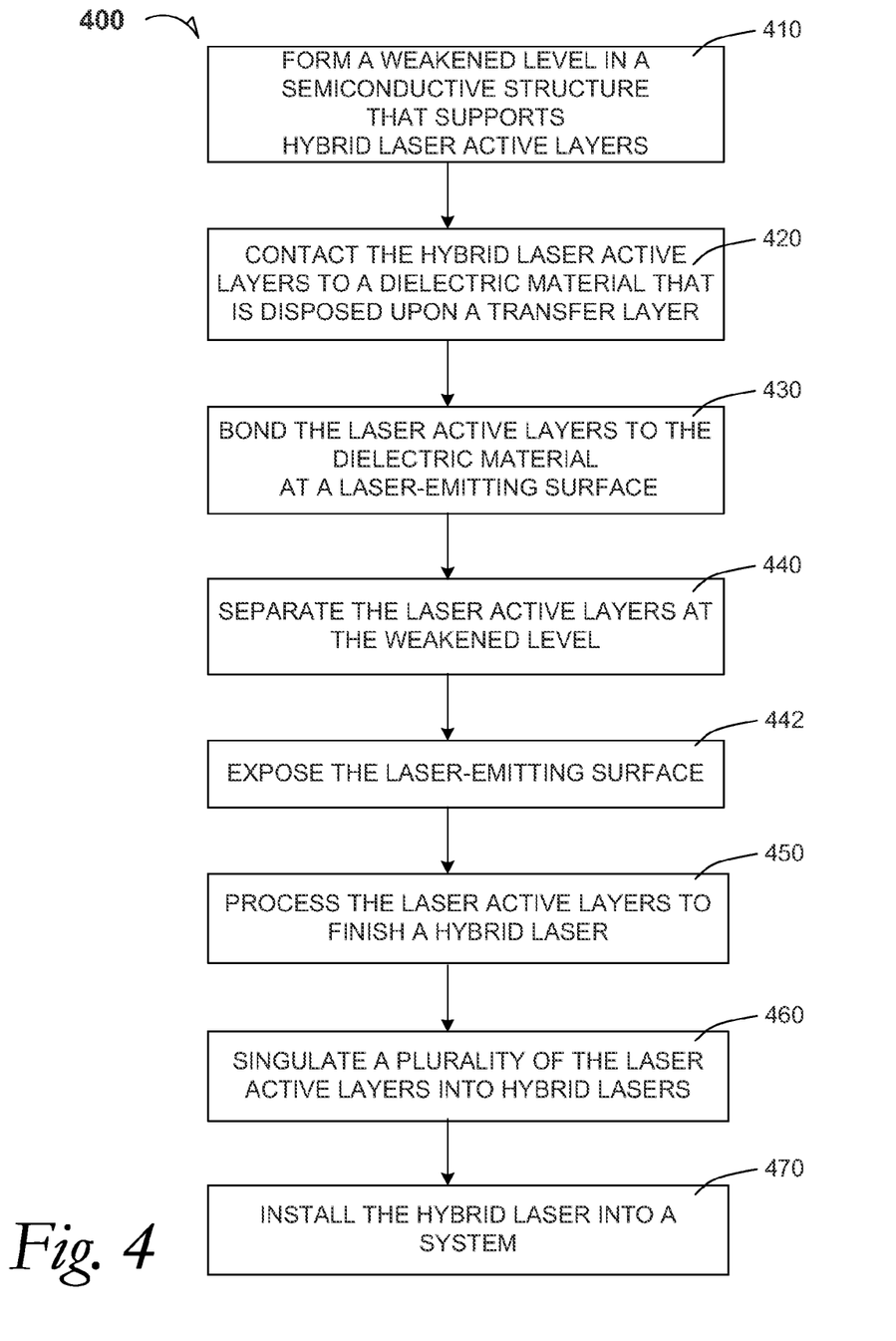
FIG. 4 is a process and method flow diagram according to an example embodiment.

FIG. 4 is a process and method flow diagram 400 according to several embodiments.

At 410, the process includes forming a weakened level in a semiconductive structure that supports hybrid laser-active layers. In a non-limiting example embodiment, a weakened level is formed by H$^+$ implantation into the semiconductive pillar 112. In an embodiment, the semiconductive pillar 112 is an InP semiconductor that may be doped with other materials such as Group II, IV, and VI dopants. In a non-limiting process embodiment, forming the weakened level 122 includes implanting through the hybrid laser-active layers 110. In a non-limiting process embodiment, forming the weakened level 322 includes implanting the semiconductive pillar 312 but not traversing the hybrid laser-active layers 310.

At 420, the process includes contacting the hybrid laser-active layers to a dielectric material that is disposed on a transfer substrate. In a non-limiting example embodiment, the hybrid laser-active layers 110 are adhered to a handle wafer 116 and they are inverted with respect to the Z-direction. The adhesion surface 118 is contacted with that dielectric material 128 that at the adhesion surface 118 of the laser-active layers 110.

At 430, the process includes bonding the hybrid laser-active layers to the dielectric material at a stack top. In a non-limiting example embodiment, the stack top 120 is bonded by heating at 300° C. and 60 minutes (1 hr).

At 440, the process includes separating the laser-active layers from the semiconductive pillar at the weakened level. In a non-limiting example embodiment, the process of bonding also effects cracking at the weakened level 122 and ELO of the hybrid laser-active layers 110.

At 442, the process includes exposing the stack top of the hybrid laser-active layers. In a non-limiting example embodiment, implanting of H$^+$ is targeted to make the weakened-level depth 124 essentially zero and upon separating the laser-active layers, the stack top 120 is exposed. In a non-limiting example embodiment, the stack top 120 is exposed by removing the residual semiconductive pillar 113 by etching. Other processes to expose the stack top of the hybrid laser-active layers are disclosed.

At 450, the process includes processing the laser-active layers to finish a hybrid laser.

At 460, the process includes singulating a plurality of the laser-active layers into hybrid lasers. Each hybrid laser may be referred to as a silicon photonics platform. The process of singulating may be done by conventional technique.

At 470, a method embodiment includes installing the hybrid laser into a system.

Figure 5:
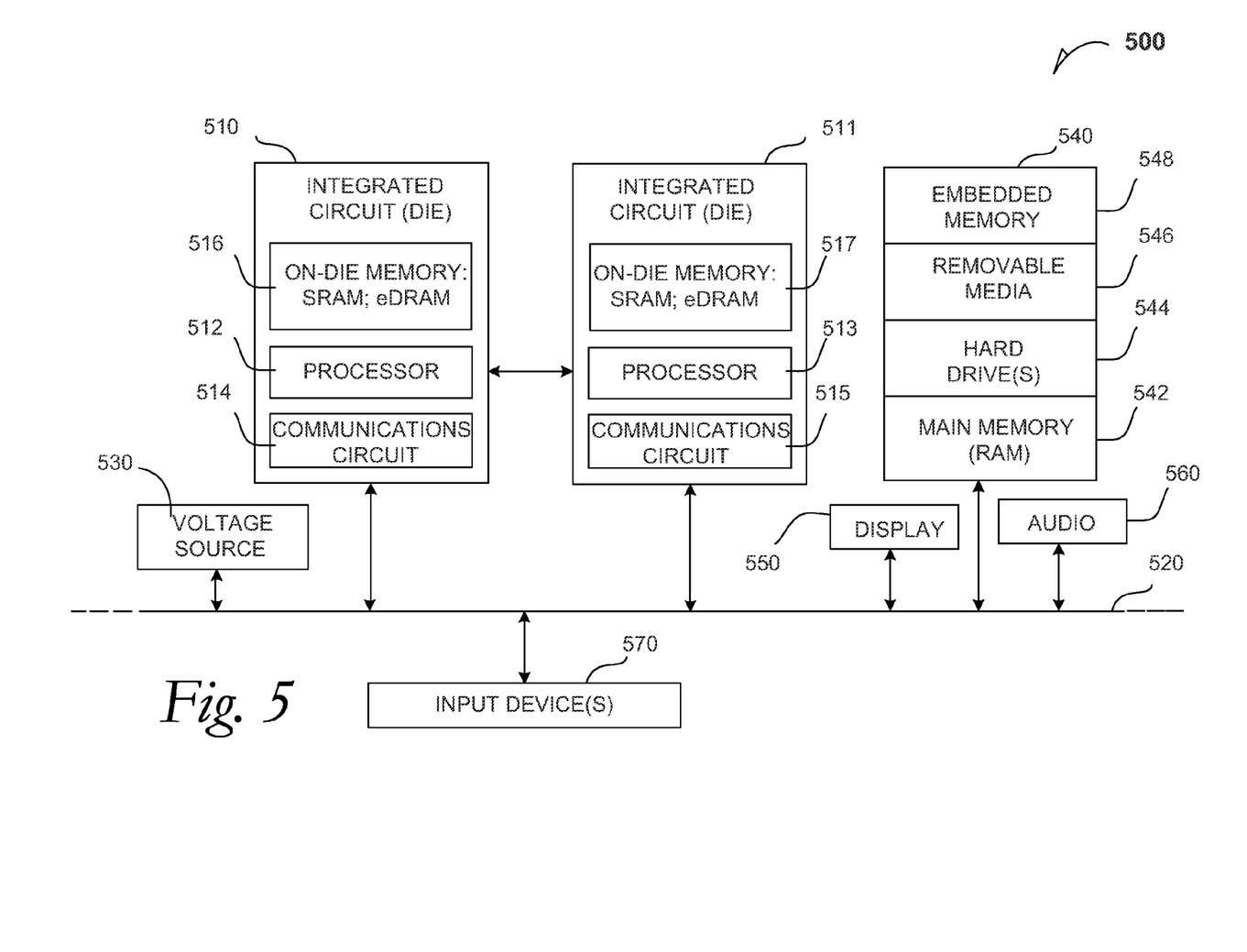
FIG. 5 is a schematic of a computer system according to an embodiment.

FIG. 5 is a schematic of a computer system 500 according to an embodiment. The computer system 500 (also referred to as the electronic system 500) as depicted can embody an ELO-fabricated hybrid laser apparatus according to any of the several disclosed embodiments and their equivalents as set forth in this disclosure. The computer system 500 may be a mobile device such as a netbook computer. The computer system 500 may be a mobile device such as a wireless smart phone. In an embodiment, the computer system 500 uses an ELO-fabricated hybrid laser apparatus as a signal-generating device where the laser-active layers are the source of signal generation.

In an embodiment, the electronic system 500 is a computer system that includes a system bus 520 to electrically couple the various components of the electronic system 500. The system bus 520 is a single bus or any combination of busses according to various embodiments. The electronic system 500 includes a voltage source 530 that provides power to the integrated circuit 510. In some embodiments, the voltage source 530 supplies current to the integrated circuit 510 through the system bus 520.

The integrated circuit 510 is electrically coupled to the system bus 520 and includes any circuit, or combination of circuits according to an embodiment. In an embodiment, the integrated circuit 510 includes a processor 512 that can be of any type. As used herein, the processor 512 may mean any type of circuit such as, but not limited to, a microprocessor, a microcontroller, a graphics processor, a digital signal processor, or another processor. In an embodiment, the processor 512 is the embedded die disclosed herein. In an embodiment, SRAM embodiments are found in memory caches of the processor. Other types of circuits that can be included in the integrated circuit 510 are a custom circuit or an application-specific integrated circuit (ASIC), such as a communications circuit 514 for use in wireless devices such as cellular telephones, smart phones, pagers, portable computers, two-way radios, and similar electronic systems. In an embodiment, the processor 510 includes on-die memory 516 such as static random-access memory (SRAM). In an embodiment, the processor 510 includes embedded on-die memory 516 such as embedded dynamic random-access memory (eDRAM).

In an embodiment, the integrated circuit 510 is complemented with a subsequent integrated circuit 511 such as an embedded subsequent die embodiment. The dual integrated circuit 511 includes a dual processor 513 and a dual communications circuit 515 and dual on-die memory 517 such as SRAM. In an embodiment, the dual integrated circuit 510 includes embedded on-die memory 517 such as eDRAM.

In an embodiment, the electronic system 500 also includes an external memory 540 that in turn may include one or more memory elements suitable to the particular application, such as a main memory 542 in the form of RAM, one or more hard drives 544, and/or one or more drives that handle removable media 546, such as diskettes, compact disks (CDs), digital variable disks (DVDs), flash memory drives, and other removable media known in the art. The external memory 540 may also be embedded memory 548 such as an ELO-fabricated hybrid laser apparatus according to an embodiment.

In an embodiment, the electronic system 500 also includes a display device 550, and an audio output 560. In an embodiment, the electronic system 500 includes an input device such as a controller 570 that may be a keyboard, mouse, trackball, game controller, microphone, voice-recognition device, or any other input device that inputs information into the electronic system 500. In an embodiment, an input device 570 is a camera. In an embodiment, an input device 570 is a digital sound recorder. In an embodiment, an input device 570 is a camera and a digital sound recorder.

As shown herein, the integrated circuit 510 can be implemented in a number of different embodiments, including an ELO-fabricated hybrid laser apparatus according to any of the several disclosed embodiments and their equivalents, an electronic system, a computer system, one or more methods of fabricating an integrated circuit, and one or more methods of fabricating an electronic assembly that an ELO-fabricated hybrid laser apparatus according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration an ELO-fabricated hybrid laser apparatus according to any of the several disclosed ELO-fabricated hybrid laser apparatus embodiments and their equivalents.

Although a die may refer to a processor chip, an RF chip or a memory chip may be mentioned in the same sentence, but it should not be construed that they are equivalent structures. Reference throughout this disclosure to "one embodiment" or "an embodiment" means that a particular feature, structure, or characteristic described in connection with the embodiment is included in at least one embodiment of the present invention. The appearance of the phrases "in one embodiment" or "in an embodiment" in various places throughout this disclosure are not necessarily all referring to the same embodiment. Furthermore, the particular features, structures, or characteristics may be combined in any suitable manner in one or more embodiments.

Terms such as "upper" and "lower" "above" and "below" may be understood by reference to the illustrated X-Z coordinates, and terms such as "adjacent" may be understood by reference to X-Y coordinates or to non-Z coordinates.

The Abstract is provided to comply with 37 C.F.R. §1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A process of forming a hybrid laser apparatus, comprising:
    forming a weakened level in a semiconductive pillar that supports laser-active layers, wherein the weakened level is formed by ion implantation into the semiconductive pillar without penetrating the laser-active layers;
    contacting the laser-active layers to a dielectric material that is disposed upon a target wafer;
    bonding the laser-active layers to the dielectric material; and
    separating the laser-active layers from the semiconductive pillar by cracking the weakened level.

2. The process of claim 1, wherein forming the weakened level is done in an InP semiconductive pillar.

3. The process of claim 1, wherein separating the laser-active layers simultaneously exposes the laser-active layers.

4. The process of claim 1, wherein forming the weakened level is done in an InP semiconductive pillar, and wherein separating the laser-active layers simultaneously exposes the laser-active layers.

5. The process of claim 1, following separating the laser-active layers, the process further including removing residual semiconductive pillar structure to expose the laser-active layers.

6. The process of claim 1, wherein the weakened level is formed by ion implanting into the semiconductive pillar.

7. The process of claim 1, wherein implanting follows said bonding the laser-active layers to the dielectric material.

8. The process of claim 1, wherein contacting includes using a handle wafer to support the semiconductive pillar.

9. A process of forming a hybrid laser apparatus, comprising:
    forming a weakened level in a semiconductive pillar that supports laser-active layers;
    contacting the laser-active layers to a dielectric material that is disposed upon a target wafer;
    bonding the laser-active layers to the dielectric material; and
separating the laser-active layers from the semiconductive pillar by cracking the weakened level, wherein bonding the laser-active layers is carried out in a range from 250° C. to 350° C. and from 0.5 hr to 1.5 hr.

10. A process of forming a hybrid laser apparatus, comprising:
    forming a weakened level in a semiconductive pillar that supports laser-active layers;
    contacting the laser-active layers to a dielectric material that is disposed upon a target wafer;
    bonding the laser-active layers to the dielectric material; and
separating the laser-active layers from the semiconductive pillar by cracking the weakened level, further including singulating the wafer to form a plurality of hybrid laser apparatus that act as silicon photonics platforms.

11. A process of forming a hybrid laser apparatus, comprising:
    forming a weakened level in a semiconductive pillar that supports laser-active layers;
    contacting the laser-active layers to a dielectric material that is disposed upon a target wafer;
    bonding the laser-active layers to the dielectric material; and
separating the laser-active layers from the semiconductive pillar by cracking the weakened level, wherein the weakened level is formed by ion implanting into the semiconductive pillar the process further including:
    removing residual semiconductive pillar structure to expose the laser-active layers, and
    singulating the wafer to form a plurality of hybrid laser apparatus.

12. A process of forming a hybrid laser apparatus, comprising:
  forming a weakened level in a semiconductive pillar that supports laser-active layers;
  contacting the laser-active layers to a dielectric material that is disposed upon a target wafer;
  bonding the laser-active layers to the dielectric material; and
  separating the laser-active layers from the semiconductive pillar by cracking the weakened level, further including:
    singulating the wafer to form a plurality of hybrid laser apparatus; and
    installing one of the hybrid laser apparatus into a system.

* * * * *

UNITED STATES PATENT AND TRADEMARK OFFICE
CERTIFICATE OF CORRECTION

| | | |
|---|---|---|
| PATENT NO. | : 8,084,282 B2 | Page 1 of 1 |
| APPLICATION NO. | : 12/753654 | |
| DATED | : December 27, 2011 | |
| INVENTOR(S) | : John Heck et al. | |

It is certified that error appears in the above-identified patent and that said Letters Patent is hereby corrected as shown below:

In the specification

Please insert:

In column 1, line 3, before "Disclosed embodiments relate to hybrid laser semiconductor microelectronic devices and processes of making them",

--STATEMENT OF GOVERNMENT INTEREST

This invention was made with Government support under contract number H98230-08-3-0011 awarded by the Department of Defense. The Government has certain rights in this invention.--

Signed and Sealed this
Fifteenth Day of March, 2016

Michelle K. Lee
*Director of the United States Patent and Trademark Office*